United States Patent [19]

Fujino

[11] Patent Number: 4,997,899

[45] Date of Patent: Mar. 5, 1991

[54] PROCESS FOR PREPARING ORGANOMETALLIC HIGH POLYMER

[75] Inventor: Masaie Fujino, Tokorozawa, Japan

[73] Assignee: Nippon Telegraph and Telephone Corporation, Tokyo, Japan

[21] Appl. No.: 488,424

[22] Filed: Feb. 27, 1990

Related U.S. Application Data

[63] Continuation of Ser. No. 280,693, Dec. 6, 1988, abandoned.

[30] Foreign Application Priority Data

Dec. 11, 1987 [JP] Japan ................... 62-312307
Dec. 5, 1988 [JP] Japan ................... 63-307578

[51] Int. Cl.$^5$ .................................... C08G 79/00
[52] U.S. Cl. ............................ 528/9; 528/10; 528/20; 528/395
[58] Field of Search ............... 528/9, 10, 20, 395

[56] References Cited

U.S. PATENT DOCUMENTS 4,618,551 10/1986 Stolka et al. .................. 430/58

OTHER PUBLICATIONS

R. West, J. Organomet. Chem., 300, pp. 327–346 (1986).
M. Stolka et al., J. Polymer Science, Part A, Polymer Chemistry 25, pp. 823–827 (1987).
P. Trefanas et al., Journal of Polymer Science, Polymer Chemistry Edition, vol. 23, pp. 2099–2107.
P. A. Bianconi et al., J. Am. Chem. Soc., 110, pp. 2342–2344 (1988).

Primary Examiner—Melvyn I. Marquis
Attorney, Agent, or Firm—Frishauf, Holtz, Goodman & Woodward

[57] ABSTRACT

An improvement in the process for preparing an organometallic polymer having a main chain constituted of silicon and/or germanium or having a main chain constituted of a linkage including carbon and silicon or germanium and further having side chain constituted of organic substituting groups, such as alkyl or aryl group. The improved process comprises the step of dehalogenating an organosilane or organogermane halide in the presence of an alkali metal and a crown ether having 28 or less carbon atoms and 10 or less oxygen atoms, whereby the organosilane or organogermane halide is polymerized by condensation. The crown ether acts as a promotor, and preferable examples used in the process of the invention include 18-crown-6 and 12-crown-4. The molecular weight of the organometallic high polymer prepared by the process of the invention distributes within a relatively narrow range in the neighborhood of about 100,000, resulting in excellent moldability of the polymer. The polymerization step is completed within a short time with good yield. The organometallic polymers prepared by the process of the invention are well suited for use as precursors for silicon carbide, photoresists, photo-initiators and photosensitive materials for electrophotography.

25 Claims, 5 Drawing Sheets

PROCESS FOR PREPARING ORGANOMETALLIC HIGH POLYMER

This application is a Continuation of application Ser. No. 07/280,693, filed Dec. 6, 1988, now abandoned.

BACKGROUND OF THE INVENTION

1. Field of the Invention

The present invention relates to an improved process for preparing organometallic polymers each having a main chain constituted of silicon and/or germanium or having a main chain constituted of a linkage of silicon or germanium in combination with carbon and further having a side chain constituted of an organic hydrocarbon residue. More particularly, it relates to novel processes for preparing such polyorganosilane compounds (also referred to as "organosilane polymers") and a polyorganogermane compounds (also referred to as "organogermane polymers").

2. Prior Art Statement

Linear polymers having silicon-silicon bonds $((R_1R_2Si)_n)$ attract increasing attention as they are applied for use as novel SiC precursors, new type photoresists, photo-initiators and photosensitive materials for electrophotography. Details of the characteristics and functions of such polymers are disclosed, for example, by R. West, J. Organomet Chem., 300, 327 to 346 (1986), M. STOLKA et al., J. Polym. Sci., Part A, Polym. Chem. 25, 823 to 827 (1987) and M. STOLKA et al , U.S. Pat. No. 4,618,551, these prior publications being incorporated herein by reference.

As a process for synthesizing an organosilane or organogermane polymer having a main chain constituted of silicon or germanium or a main chain constituted of either one or both of silicon and germanium in combination with carbon, it has been known in the art a process wherein the objective polymer is produced by subjecting a dihalide of corresponding organic hydrocarbon to dehalogenating condensation by the use of an alkali metal, the reaction being represented by the following reaction formula of:

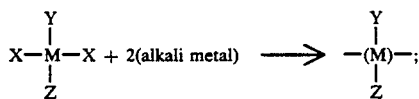

wherein M is silicon or germanium, or a hydrocarbon residue having silicon or germanium; X is a halogen atom; and Y and Z each stands for an organic hydrocarbon residue. When a mixture of plural monomers is used in the reaction represented by the preceding reaction formula, a copolymer may be produced. Details of such reaction may be had by referring to P. Trefanas et al., Journal of Polymer Science, Polymer Chemistry Edition, Vol. 23, pp 2099 to 2107 (1985), "Organogermane Homopolymers and Copolymers with Organosilanes", which will be incorporated herein as reference liternature.

However, the yield of a high polymer attainable by this known process is generally low, and particularly the yield of a high polymer which has a molecular weight of more than 100,000 and properties to be readily molded in a form of film or like materials is so low as less than 10%.

OBJECT AND SUMMMARY OF THE INVENTION

Accordingly, the principal object of this invention is to provide a process for preparing an organosilane polymer or organogermane polymer having a molecular weight of not less than 100,000, the yield of which has been unsatisfactorily low in the known processes, at high yield within a short reaction or processing time.

The object of this invention is achieved by the provision of a process for preparing an organometallic polymer having a main chain constituted of silicon and/or germanium or having a main chain constituted of a linkage including carbon and silicon or germanium and further having a side chain constituted of an organic hydrocarbon group, said organometallic polymer being formed through a reaction between the corresponding organometallic halide and an alkali metal, an improved process which comprises the step of polymerizing said organometallic halide in the presence of an alkali metal and a crown ether having 28 or less carbon atoms and 10 or less oxygen atoms.

The dehalogenation reaction utilized in the aforemenationed conventional process wherein an organic metal halide is dehaloganated under reflux of toluene and in the presence of an alkali metal or an alloy thereof is one of the so-called Wurtz reactions. The reaction speed thereof is determined by the nucleophilic reaction of a complex of (organometallic anion-alkali metal cation) with an organic metal halide, the complex being produced during the reaction. On the other hand, it has been known that a crown ether captures the alkali metal ion of the alkali metal ion complex to activate the counter anion. The present invention is accomplished by favourably making use of a crown ether as a promotor in the aforementioned reaction to activate an organic metallic anion thereby to enhance the nucleophilic inclination of the organic anion to the nuclear of an organic metal dihalide, whereby the reaction speed is increased so that an organometallic high polymer is produced at high yield within a short time.

The most important aspect of this invention resides in that an organic metal halide is dehalogenated in the presence of an alkali metal with coexisting crown ether which acts as a promotor, followed by condensation polymerization, to synthesize an organometallic polymer. A copolymer may be produced when plural organic metal halides are used.

DESCRIPTION OF THE INVENTION

The metallic elements in the organic metal halides used in the process of the invention are silicon and/or germanium, whereas the halogen atoms in the organic metal halides are preferably chlorine and bromine. Examples of preferable organic metal halides used in the invention includes dimethyl dichlorosilane, methyl propyl dichlorosilane, methyl n-hexyl dichlorosilane, methyl n-dodecyl dichlorosilane, methyl β-phenethyl dichlorosilane, methyl phenyl dichlorosilane, methyl p-tolyl dichlorosilane, (2-(3-((trimethylsilyl)oxy)-phenyl)propyl)methyldichlorosilan e 1,1-dichloromethyl-2,2-dimethylphenyldisilane, di-n-hexyl dichlorosilane, bis(p-n-hexylphenyl)dichlorosilane, methyl 2-(4-cyclohexenyl)ethyl dichlorosilane, dibutyl dichlorogermane, 1,4-bis(chloroethylmethylsilyl)-benzene, 1,1,2,2-tetrachlorodiisopropyl disilane, propyl trichlorosilane, n-hexyl trichlorosilane and dichlorodecamethyl cyclohexasilane.

Crown ethers which may be used in the process of the invention together with an alkali metal includes, for example, 18-crown-6, 15-crown-5, 12-crown-4, 1,3,5-trioxane, 1,4-dioxane, dicyclohexyl 18-crown-6, cyclohexyl 18-crown-6, dibenzo 30-crown-10, dibenzo 24-crown-8 and dibenzo 18-crown-6.

In the condensation polymerization reaction system utilized in the present invention, in which dehalogenation reaction takes place, an organic solvent such as toluene and petroleum base solvents may be used. Examples of usable alkali metals are lithium, sodium and potassium.

The structural units (or linkage units) of the organometallic polymer synthesized by the process of this invention will now be listed below.

(1) Permethyl polysilane; —(Me)$_2$Si- (2) Methyl propyl polysilane; —(Me)(Pr)Si- (3) Methyl n-hexyl polysilane; —(Me)(n-Hex)Si- (4) Methyl dodecyl polysilane; —(Me)(Dodecyl)Si- (5) Methyl (β-phenetyl) polysilane; —(Me)(β-Phenetyl)Si- (6) Methyl phenyl polysilane; —(Me)(Phenyl)Si- (7) Methyl p-tolyl polysilane; —(Me)(p-tolyl)Si- (8) Poly(2-(3-((trimethylsilyl)oxy)phenyl)propyl)methylsilylene; —(2(3((Trimethylsilyl)oxy)phenyl)propyl)(Me)-Si- (9) Methyl(dimethylphenylsilyl)polysilane; —(Me)(Dimethylphenylsilyl)Si-

(10) Di-n-hexyl polysilane; —(n-hex)$_2$Si-

(11) Bis(p-hexylphenyl) polysilane; —(p-Hexphenyl)$_2$Si-

(12) (Dimethylsilylene)—(methylphenylsilylene) copolymer; —(Me)$_2$Si—(Me)(Phenyl)Si-

(13) (Methylpropylsilylene)—(methylphenylsilylene) copolymer; —(Me)(Pr)Si—(Me)(Phenyl)Si-

(14) Methyl(2—(4-cyclohexenyl)ethyl)silylenemethylphenylsilylene copolymer; —(Me)

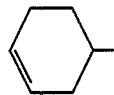

(CH$_2$)$_2$)Si—(Me)(Phenyl)Si-

(15) Dibutyl polygermane; —(Bu)$_2$Ge-

(16) (Dibutylgermylene)—(methyl n-hexyl silylene) copolymer; —(Bu)$_2$Ge-(Me)(n-Hex)Si-

(17) Poly(p-(1,2-diethyldimethyldisilanylene)phenylene); —Si(Me)(Et)-Si(Me)(Et)-C$_6$H$_4$-

(18) Perisopropyl ladder polysilane;

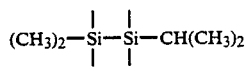

(19) Poly(n-propyl silyne); —→Si(Pr)
(20) Poly(n-hexyl silyne); —→Si(n-Hex)
(21) Poly(permethylcyclohexasilane);

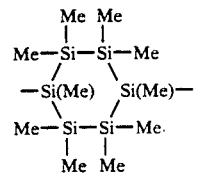

EXAMPLES OF THE INVENTION

Figure 1:
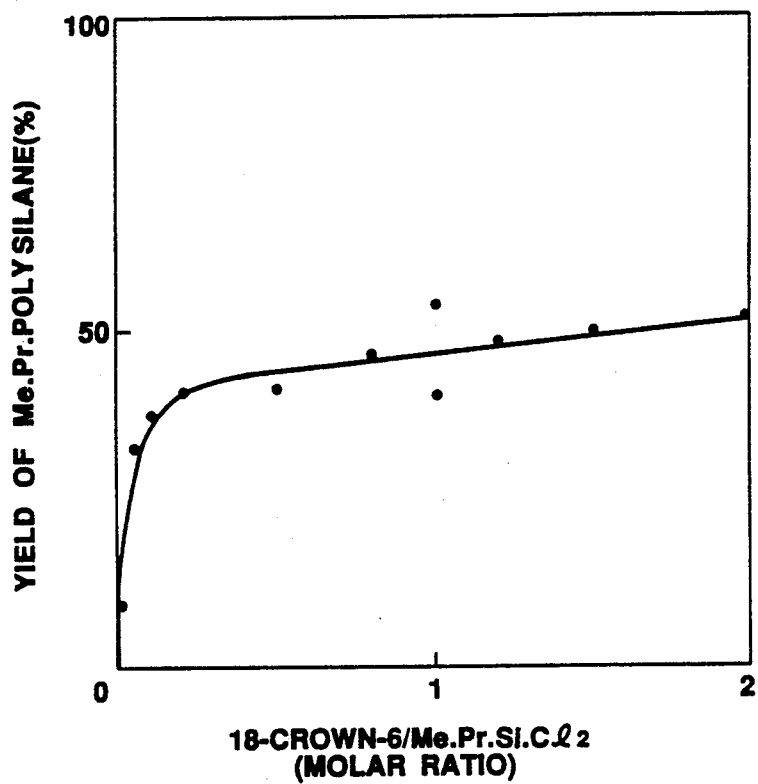
FIG. 1 is a graphic representation showing the dependency of the yield of polymerization of methylpropyl polysilane on the added amount (molar ratio to monomer) of 18-crown-6.
Figure 2:
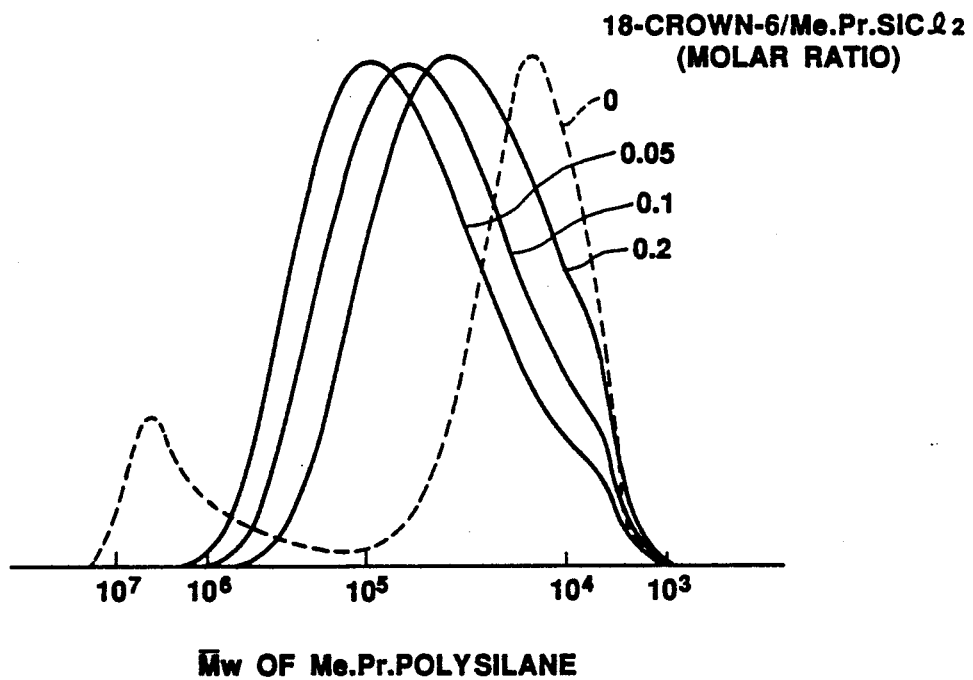
FIG. 2 is a graphic representaion showing the dependency of the molecular weight distribution of methylpropyl polysilane on the added amount (molar ratio to monomer) of 18-crown-6.

The present invention will now be described more specifically by referring to some examples thereof. However, it is hereby noted that the invention should not be limited by the following examples in any sense, the scope of the invention being restricted only by the appended claims and should be construed broadly as far as the disclosure of the specification and claims.

In all of the following Examples, the reaction systems were placed in the atmosphere of argon stream.

EXAMPLE 1

Synthesis of Permethyl polysilane (1)

A 20 ml four-necked flask was fitted with a stirrer and a reflux condenser. Into the flask added were 50 ml of toluene which had been dehydrated and refined, 1.0 g of 18-crown-6 and 2.1 g of freshly cut sodium metal. The content in the flask was heated and stirred to melt the sodium metal and to disperse sodium metal particles. 5 g of dimethyl dichlorosilane was added from an injector, followed by heating and stirring for additional 30 minutes. The reaction mixture was cooled to room temperature, and then the flask containing the reaction mixture was immersed in an isopropyl alcohol bath which was cooled with ice from the outside. 20 ml of ethanol was added to the cooled reaction mixture little by little to convert the unreacted sodium metal to sodium alcoholate. After stirring for an hour, the reaction mixture was added to 700 ml of ethanol little by little, whereby a precipitate was formed. The precipitate was filtered off and rinsed with water for three times and rinsed with methanol for three times to obtain a powder-form product which was dried under vacuum. The yield of the powder-form product, permethyl polysilane, was 80%. The product was insoluble in water and almost all organic solvents and was not melted by heating.

EXAMPLE 2

Synthesis of Methylpropyl Polysilane (2)

The flask used for synthesis was the same as used in Example 1. Into the flask added were 50 ml of dehydrated and refined toluene, 8.9 g of 18-crown-6 and 1.7 g of freshly cut sodium metal. The content in the flask was heated under stirring to melt the sodium metal and to disperse sodium metal particles, and then 5 g of methyl propyl dichlorosilane was added from an injector. After heating under stirring for additional 30 minutes, the reaction mixture was cooled to room temperature. Similarly as in Example 1, the flask was immersed in isopropyl alcohol bath cooled by ice, and 20 ml of ethanol was added to the reaction mixture to convert the unreacted sodium metal to sodium alcoholate. After stirring the reaction mixture under cooling for an hour, the reaction mixture was added to 700 ml of ethanol little by little, whereby a precipitate was formed. The precipitate was filtered off, followed by rinsing with water for three time and with methanol for three times. The rinsed precipitate was dried in vacuum. The dried product was dissolved in toluene and insoluble substances were removed by filtering. The solution of the product in toluene was added to 700 ml of methanol dropwisely to re-precipitate the product. The re-precipitated product was filtered off using a glass filter, followed by rinsing with methanol and drying in vacuum, to obtain methyl propyl polysilane. The yield of the thus obtained methyl propyl polysilane was 57%. The yield of this Example, in which a crown ether was used in accordance with the present invention, was about 4 times as high as those of conventional processes wherein no crown ether were used.

The dependency of the yield of polymerization of methyl propyl polysilane on the added quantity of 18-crown-6 is shown in FIG. 1. It will be seen from FIG. 1 that sufficient effect was observed when 18-crown-6 was added in a ratio of 0.1 (molar ratio to 1 mol of monomer). The molecular weight distribution of the resultant methyl propyl polysilane was examined by gel permeation chromatography, the elution profile being shown in FIG. 3. It will be seen from the profile that the major fraction of the polymer prepared in accordance with the process of this invention distributes approximately at a molecular weight of 100,000, and that low molecular weight fractions of less than about 10,000 are smaller when compared to a polymer prepared by a conventional process.

Table 1 shows the interrelation between the yield of methyl propyl polysilane and the added quantity of the crown ether used as a promotor. Throughout the experiments set forth in Table 1, the reaction time was 30 minutes and the added quantity of each crown ether was 1.0 by molar ratio of 1 mol of monomer.

TABLE 1

| Crown Ether | Yield (%) of Methyl Propyl Polysilane |
|---|---|
| Not added | 16 |
| 18-Crown-6 | 57 |
| 18-Crown-6[a] | 26 |
| 15-Crown-5 | 52 |
| 12-Crown-4 | 35 |
| 1,3,5-Trioxane | 42 |
| 1,4-Dioxane | 37 |
| Dicyclohexyl 18-Crown-6 | 56 |
| Cyclohexyl 18-Crown-6 | 56 |
| Dibenzo 30-Crown-10 | 37 |
| Dibenzo 24-Crown-8 | 45 |
| Dibenzo 18-Crown-6 | 58 |
| 18-Crown-6/12-Crown-4[b] | 50 |
| 18-Crown-6/1,4-Dioxane[c] | 53 |

Note:
[a] 18-Crown-6 was added in a molar ratio of 0.001 to 1 mol of the used monomer.
[b] The ratio of 18-crown-6 to 12-crown-4 was 0.8 to 0.2, and the molar ratio of the combined ethers to the monomer being 1.0.
[c] 1,4-Dioxane was used to serve as a solvent, and the molar ratio of 18-crown-6 was 0.1 to 1 mol of the monomer.

EXAMPLE 3

Synthesis of Di-n-hexyl Polysilane

Figure 3:
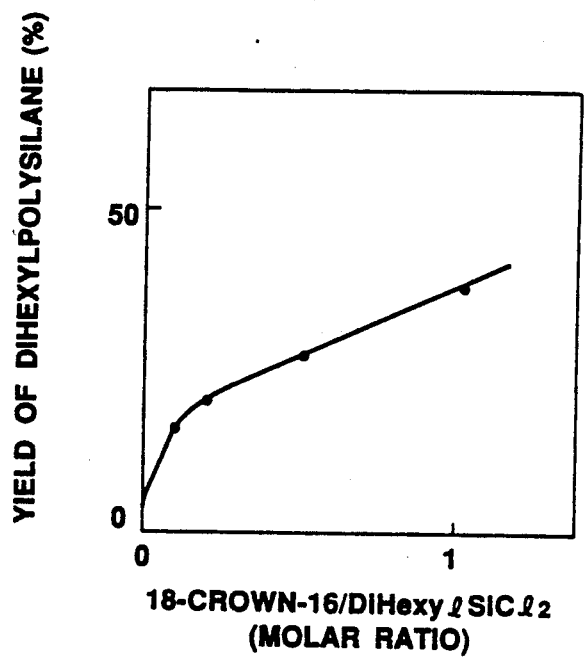
FIG. 3 is a graphic representaion showing the dependency of the yield of polymerization of di-n-hexyl polysilane on the added amount of 18-crown-6.
Figure 4:
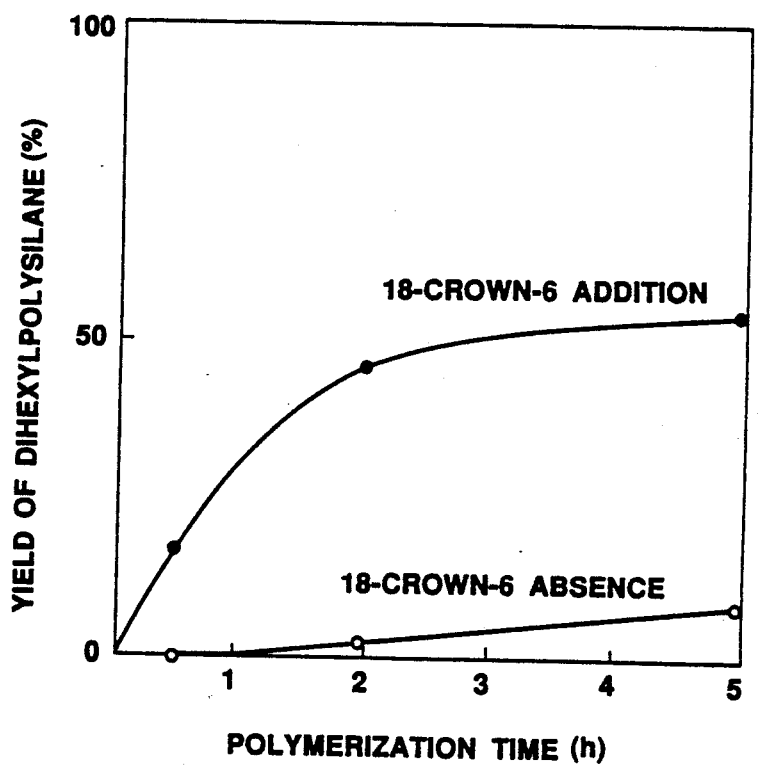
FIG. 4 is a graphic representaion showing the dependency of the yields of polymerization of di-n-hexyl polysilane on the reaction time (18-crown-6 being added to the one reaction system, and not added to the other reaction system)
Figure 5:
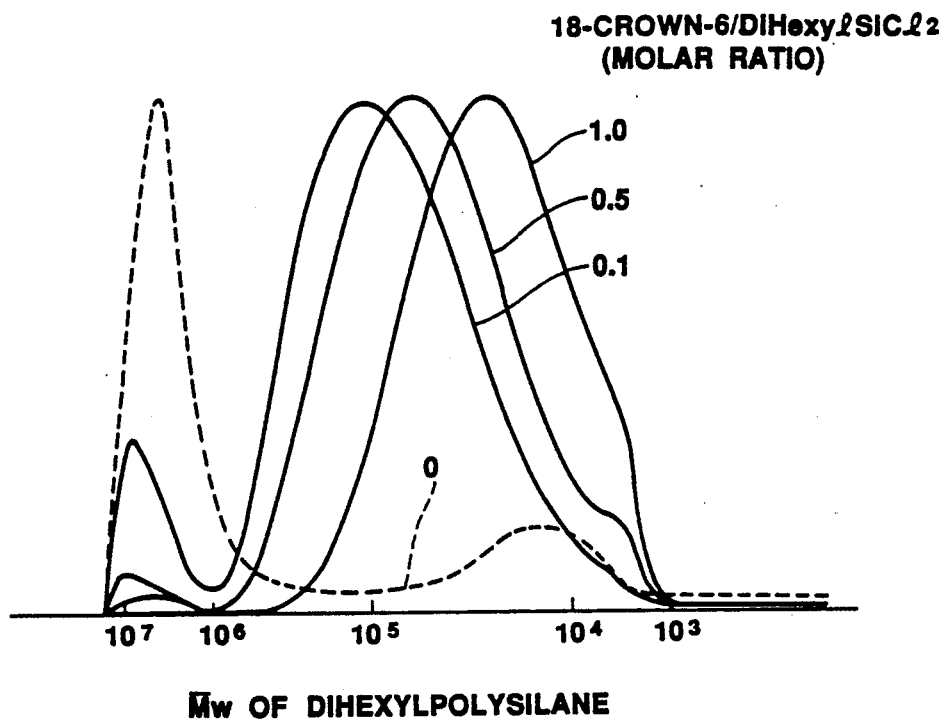
FIG. 5 is a graphic representaion showing the dependency of the molecular weight distribution of di-n-hexyl polysilane on the added amount of 18-crown-6 (molar ratio of 18-crown-6/DihexylSiCl$_2$)
Figure 6:
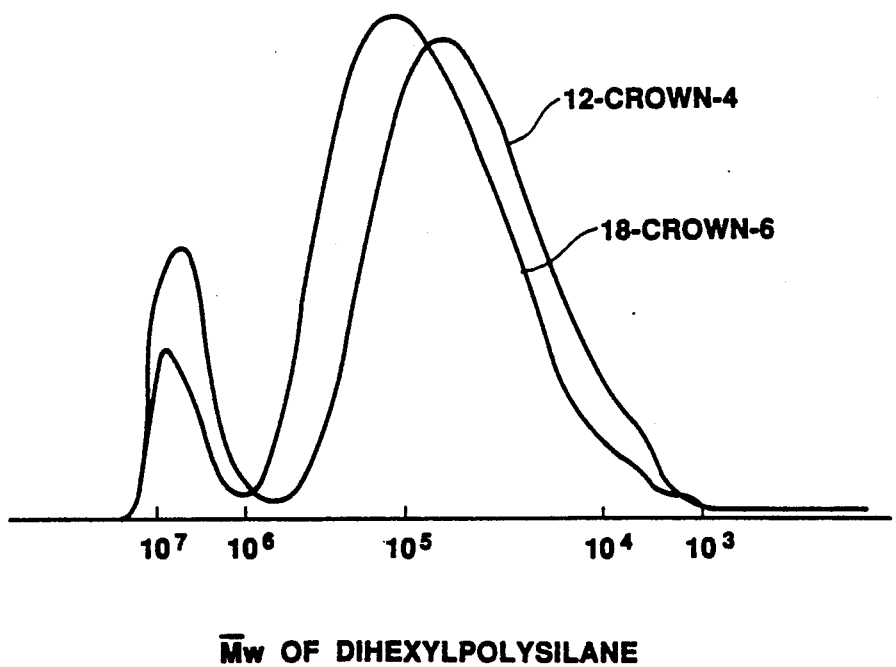
FIG. 6 is a graphic representation showing the change in molecular weight of di-n-hexyl polysilane when different crown ethers (12-crown-4 and 18-crown-6 in the illustrated embodiments) are used.
Figure 7:
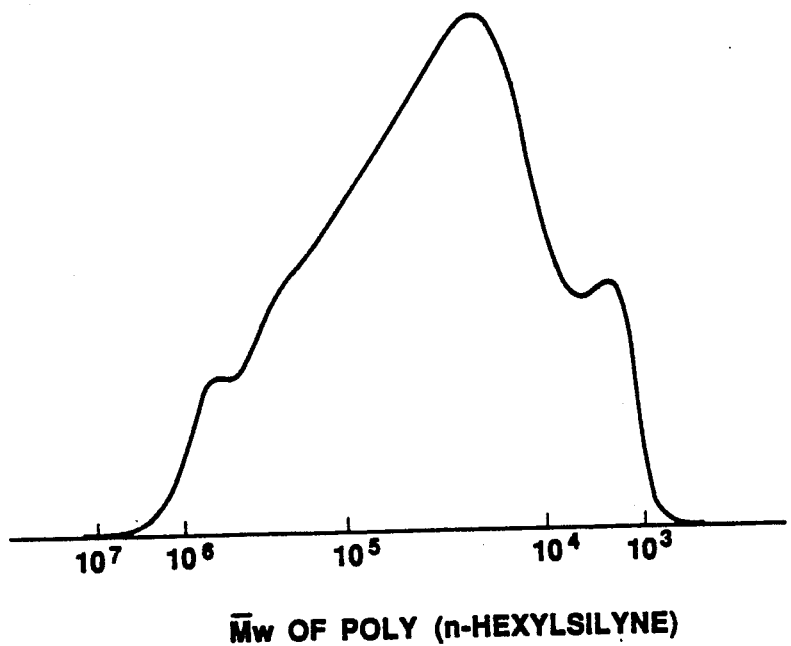
FIG. 7 shows the molecular weight distribution of poly(n-hexylsilyne)

The flask used for synthesis was the same as used in Example 1. Into the flask added were 50 ml of dehydrated and refined toluene, 0.48 g of 18-crown-6 and 1.03 g of freshly cut sodium metal. The content in the flask was heated under stirring to melt the sodium metal and to disperse sodium metal particles, and then 5 g of di-n-hexyl dichlorosilane was added from an injector. The following procedure was same as that described in Example 2. The yield of the thus obtained di-n-hexyl polysilane was 17%. The yield of this Example, in which a crown ether was used in accordance with the present invention, was about 300 times as high as those of conventional processes wherein no crown ether were used. The dependency of the yield of polymerization of di-n-hexyl polysilane on the added quantity of 18-crown-6 is shown in FIG. 3. The reaction time was 30 minutes. FIG. 4 shows the interrelation between the yield (%) of polymerization of di-n-hexyl polysilane and the reaction time when 18-crown-6 was not added. The effect attainable by the addition of 18-crown-6 will be apparent from these Figures. The dependency of the molecular weight distribution of di-n-hexyl polysilane on the added amount of 18-crown-6 is shown in FIG. 5, in which the molecular weight distribution of di-n-hexyl polysilane prepared without using 18-crown-6 is shown by the broken line and the molar ratios of added 18-crown-6/di(n-hexyl)SiCl$_2$ are denoted by numerals attached to respective real line curves. It was revealed, as will be seen from FIG. 5, that the maximum peak of the molecular weight distribution of the polymer was shifted to the lower molecular weight side as the added amounts of 18-crown-6/di(n-hexyl)SiCl$_2$ were changed to 0.1, 0.5 and 1.0, and that the amount of polymers having molecular weight of around 10$^5$ were satisfactorily obtained at the amount of 0.1 of added 18-crown-6/di(n-hexyl)SiCl$_2$. Further referring to FIG. 7 showing the molecular weight distribution of di-n-hexyl polysilane (polydi(n-hexylsilylene)) prepared in the presence of 12-crown-4 and 18-crown-6. The crown ethers were added in a molar ratio of crown ethers to di-n-hexyl dichlorosilane monomer of 0.1 to 1.

The following Table 2 shows the change in yield of di-n-hexyl polysilane when different crown ethers are used.

TABLE 2

| Crown Ether | Yield (%) of Di-n-hexyl Polysilane |
| --- | --- |
| Not Added | 0.05 |
| 18-Crown-6 | 17 |
| 15-Crown-5 | 17 |
| 12-Crown-4 | 31 |
| Dibenzo 18-Crown-6 | 2 |

Note:
Reaction Time = 30 minutes
Added amount of each crown ether was 0.1 by molar ratio to 1 mol of monomer.

EXAMPLE 4

Synthesis of Copolymer (13) of Methyl Propyl Silylene and Methyl Phenyl Silylene The flask used for synthesis was the same as used in Example 1. Into the flask added were 50 ml of toluene which had been dehydrated and refined, 0.15 g of 18-crown-6 and 3.2 g of freshly cut sodium metal. The content in the flask was heated and stirred to melt the sodium metal and to disperse sodium metal particles. A mixture containing 5 g of methyl propyl dichlorosilane and 5 g of methyl phenyl dichlorosilane was added from an injector, followed by heating and stirring for additional 30 minutes. The reaction mixture was cooled to room temperature, and then the flask containing the reaction mixture was immersed in an isopropyl alcohol bath which was cooled with ice from the outside. 30 ml of ethanol was added to the cooled reaction mixture little by little to convert the unreacted sodium metal to sodium alcoholate. After stirring for an hour, the reaction mixture was added to 700 ml of ethanol little by little, whereby a precipitate was formed. The precipitate was filtered off and dried in vacuum. The dried product was dissolved in 100 ml of toluene, followed by removal of substances which were insoluble in toluene. The thus purified product was re-precipitated in 1.5 liters of methanol, whereby a methyl propylsilylene-/methyl phenyl silylene copolymer was obtained at a yield of 52%.

EXAMPLE 5

Synthesis of Perisopropyl Ladder Polysilane

The flask used for synthesis was the same as used in Example 1. Into the flask added were 50 ml of toluene which had been dehydrated and refined, 0.46 g of 18-crown-6 and 1.9 g of freshly cut sodium metal. The content in the flask was heated and stirred to melt the sodium metal and to disperse sodium metal particles, to which dropwisely added was a solution containing 5 g of 1,1,2,2-tetrachlorodiisopropyl disilane dissolved in 20 ml of toluene. After the completion of dropwise addition, the content in the flask was heated for additional 30 minutes. The following procedure for purification was the same as described in Example 2. As a result, perisopropyl ladder polysilane of yellow color was prepared at a yield of 50%.

EXAMPLE 6

Synthesis of Poly(n-hexylsilyne)

The flask used for synthesis was the same as used in Example 1. Into the flask added were 50 ml of toluene which had been dehydrated and refined, 0.5 g of 12-crown-4 and 2.3 g of freshly cut sodium metal. The content in the flask was heated and stirred to melt the sodium metal and to disperse sodium metal particles, to which dropwisely added was a solution containing 6.2 g of n-hexyl trichlorosilane dissolved in 20 ml of toluene. After the completion of dropwise addition, the content in the flask was heated for additional one hour to continue the reaction. Then, the reaction mixture was cooled to room temperature. In order to introduce butyl groups at the terminals of the product, 25 ml of a 10% butyl lithium solution in hexane was added followed by stirring for an hour. The reaction mixture was then added with 30 ml of ethanol little by little, and then stirred for 2.5 hours to convert the unreacted metal sodium to sodium alcoholate. The formed precipitate was filtered to obtain an objective product which was rinsed with water and methanol respectively for three times. After drying the product, the product was dissolved in a mixed solvent composed of 30 ml of toluene and 20 ml of tetrahydrofuran (THF). The insoluble substances were removed, and the solution in toluene-THF was added to 700 ml of methanol little by little to re-precipitate the product which was filtered by a glass filter. The product left on the glass filter was rinsed with methanol, followed by drying in vacuum, to obtain poly(n-hexylsilyne) of yellow color at a yield of 100%.

Figure 8:
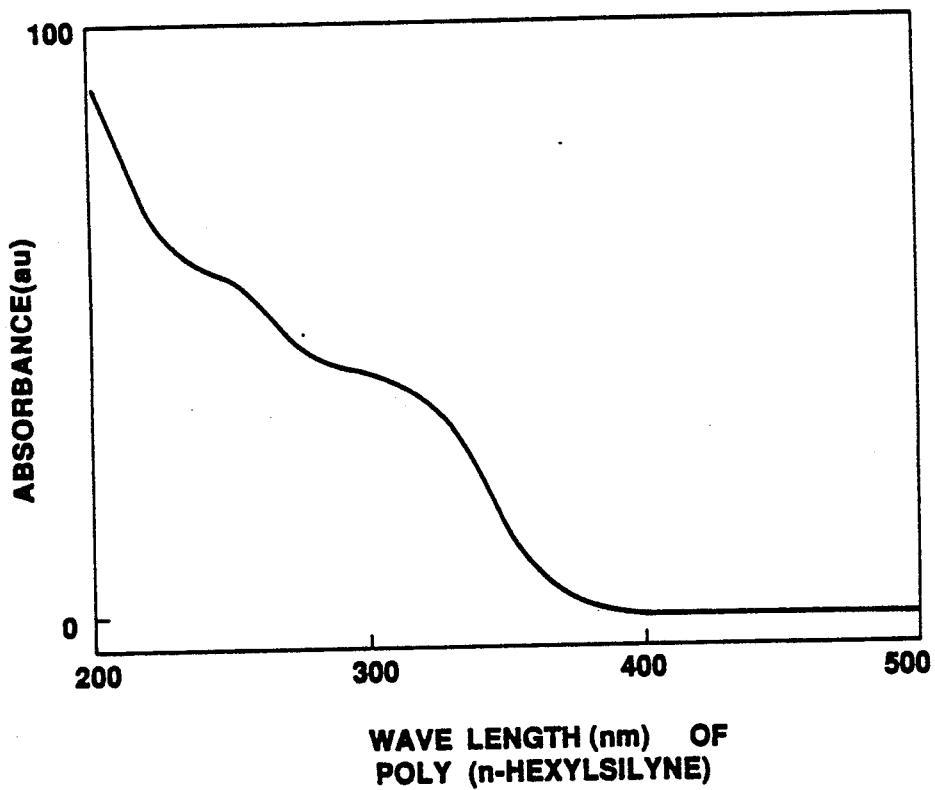
FIG. 8 is a chart showing the UV absorption spectrum of poly(n-hexylsilyne)
Figure 9:
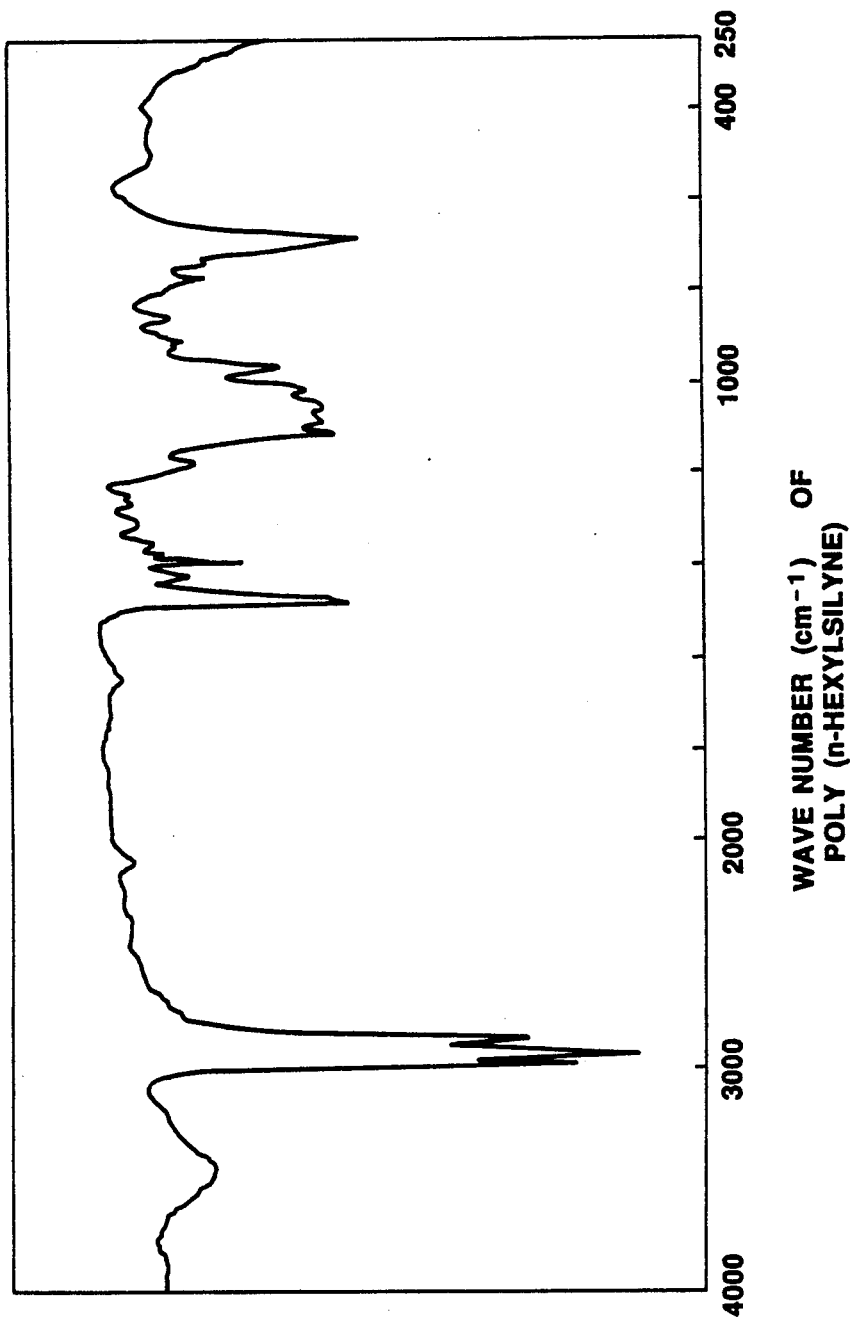
FIG. 9 is a chart showing the IR spectrum of poly(n-hexylsilyne).

The molecular weight distribution of the thus prepared poly(n-hexylsilyne) is shown in FIG. 7. The UV absorption spectrum of the poly(n-hexylsilyne) product is shown in FIG. 8. It was revealed that the spectrum curve of the UV absorption spectrum of the product was approximately coincident with the spectrum curve shown in a prior art reference (P. A. Bianconi et al., J. Am. Chem. Soc., 110 342 (1988)) to ascertain that a two-dimensional skeletal linkage of silicon was formed in the product poly(n-hexylsilyne). FIG. 9 is a chart showing the IR spectrum of the product poly(n-hexylsilyne), in which a broad absorption peak is found at 1000 to 1100 cm$^{-1}$. This shows that few Si-O-Si bonds are included in the structure of the product.

EXAMPLE 7

In the preceding Examples 1 to 6, one or more crown ethers were used together with sodium metal to serve as promotors, according to this invention, so that organic silicon chlorides were dechlorinated and polymerized by condensation to obtain polysilanes. For the comparison purpose, polymers were prepared in accordance with the known processes in which any crown ether was not used while using alkali metals, such as lithium metal, sodium metal and an alloy of sodium/potassium. The first known process was conducted the inventor, and the second known process had been conducted by research workers other than us. The thus prepared organometallic polymers are denoted by the numbers set forth in the captions of preceding Examples. The results are tabulated in Table 3 set forth hereinafter.

The time costed for polymerization in the process of this invention was 30 minutes except for polymer Nos. (19) and (20), and 18-crown-6 was added in an amount of 0.01 by molar ratio to the used monomer except for the cases otherwise described hereinbelow. The time costed for polymerization in the first known process was 30 minutes, and that in the second known process was 3 hours. 0.1 (molar ratio to 1 mol of monomer) of 18-crown-6 was used as the crown ether for the preparation of permethyl polysilane (1), methyl n-hexyl polysilane (3), methyl dodecyl polysilane (4), methyl (β-phenetyl) polysilane (5), di-n-hexyl polysilane (10), poly(p-(1,2-diethyldimethyldisilanilene)phenylene (17) and poly(permethylcyclohexasilane) (21). 1.0 (molar ratio to 1mol of monomer) of 18-crown-6 was used for the preparation of methyl propyl polysilane (2) in the process of this invention. In each of the processes of this invention for preparing poly(propyl silyne) (19) and poly(n-hexyl silyne) (20), the time costed for polymerization was one hour. In the second known processes for the preparation of polymers (g), (H), (i) and (k), the time costed for polymerization were different from that described above, the polymer (g) being prepared by polymerizing for 5 hours in a mixed solvent of toluene/diglime (7/3). (In this connection reference should be made to Macromolecules, 19, 611 to 616 (1986).) The polymerization time for the preparation of the polymer (h) was 1.5 hours, and that for the polymer (i) was 24 hours, being polymerized in a mixed solvent of THF/benzene (½) at room temperature while using lithium metal. The time costed for polymerization of the polymer (k) was 5 minutes, and the polymer (k) was prepared by polymerizing the monomer in pentane while using an alloy of sodium/potassium and by exposing the reaction mixture to a high intensity ultrasonic wave (see J. Am. Chem. Soc., Vol. 110, No. 7, 2342 to 2344, (1988)).

TABLE 3

| Organometallic Polymer | Process of Invention | First Known Process | Second Known Process |
| --- | --- | --- | --- |
| (1) | 80 | — | 80 |
| (2) | 57 | 16 | 45 |
| (3) | 32 | 3 | 11 |
| (4) | 24 | — | 8 |
| (5) | 65 | 21 | 35 |
| (6) | 87 | 21 | 55 |
| (7) | 67 | — | 25 |
| (8) | 52 | — | 18 |
| (9) | 30 | — | 10 |
| (10) | 65 | 0.05 | 34$^{(g)}$ |
| (11) | 21 | — | 6 |
| (12) | 68 | — | 23 |
| (13) | 52 | — | 31$^{(h)}$ |
| (14) | 32 | 8 | 12 |
| (15) | 48 | 14 | 15 |
| (16) | 62 | — | 21 |
| (17) | 78 | — | 48 |
| (18) | 50 | — | 98$^{(i)}$ |
| (19) | 100 | — | — |
| (20) | 100 | — | 33$^{(k)}$ |
| (21) | 60 | — | 73 |

Note (Second known processes utilized):
(1): J. Polym. Sci; Polym. Chem. Ed., 17, 2833 to 2843 (1979)
(3), (4), (5), (6), (7): J. Polym. Sci., Polym. Lett. Ed. 21, 819 to 822
(15), (16): J. Polym. Sci., Polym. Chem. Ed. 23, 2099 to 2107 (1985)
(17): J. Polym. Sci., Polym. Lett. Ed. 22, 669 to 671 (1984)
(21): J. Polym. Sci., Polym. Let. Ed. 26, 25 to 32 (1988)

Different from the conventional processes, exemplified by the first and second known processes, one or more crown ethers are used in addition to alkali metals, in accordance with the distinctive patentable feature of this invention. The major fractions of molecular weights of the polymers prepared by the process of this invention distribute in the neighborhood of 100,000. The reaction time required for polymerization can be conveniently shortened by the use of one or more crown ethers, with more favorite merit that the yields of the resultant polymers are exceedingly high.

The organometallic polymers produced by the process of this invention are excellent in molding properties, have molecular weights of around 100,000 with the molecular weight distribution of relatively narrow range. The organometallic copolymers obtainable by the process of this invention are well suited for use as precursors for silicon carbide, photo resist materials and photosensitive materials for electrophotography.

What is claimed is:

1. In a process for preparing an organometallic polymer having a main chain constituted of silicon and/or germanium or having a main chain constituted of a linkage including carbon and silicon or germanium and further having a side chain constituted of an organic hydrocarbon group, said organometallic polymer being formed by a reaction between the corresponding organometallic halide and an alkali metal, said organometallic halide containing silicon or germanium as the metal, two halogen atoms and as the organo radical, an alkyl group or aryl group or both an alkyl and an aryl group; the improvement which comprises the step of polymerizing said organometallic halide in the presence of the alkali metal and a crown ether having up to 28 carbon atoms and up to 10 oxygen atoms.

2. The process of claim 1, wherein said organometallic halide is at least one selected from the group consisting of dimethyl dichlorosilane, methyl propyl dichlorosilane, methyl n-hexyl dichlorosilane, methyl n-dodecyl dichlorosilane, methyl β-phenethyl dichlorosilane, methyl phenyl dichlorosilane, methyl p-tolyl dichlorosilane, (2-(3-((trimethylsilyl)oxy)phenyl)-propyl)methyldichlorosilane, 1,1-dichloromethyl-2,2-dimethylphenyldisilane, di-n-hexyl dichlorosilane, bis(p-n-hexylphenyl)dichlorosilane, methyl 2-(4-cyclohexenyl)ethyl dichlorosilane, dibutyl dichlorogermane, 1,4-bis(chloroethlmethylsilyl)-benzene, 1,2,2-tetrachlorodiisopropyl disilane, propyl trichlorosilane, n-hexyl trichlorosilane and dichlorodecamethyl cyclohexasilane.

3. The process of claim 1, wherein said crown ether is at least one selected form the group consisting of 18-crown-6, 15-crown-5, 12-crown-4, 1,3,5-trioxane, 1,4-dioxane, dicyclohexyl 18-crown-6, cyclohexyl 18-crown-6, dibenzo 30-crown-10, dibenzo 24-crown-8 and dibenzo 18-crown-6.

4. The process of claim 1, wherein said crown ether is either one or a combination of 18-crown-6 and 12-crown-4.

5. A process for preparing an organosilane polymer having a main chain constituted of a silicon linkage and having a side chain constituted of an organic hydrocarbon group, comprising the step of polymerizing by a condensation polymerization reaction, a corresponding organosilicon halide containing 2 halogen atoms in the presence of an alkali metal and a crown ether selected from the group consisting of 18-crown-6, 12-crown-4 and their admixture.

6. The process of claim 5, wherein said organosilicon halide is at least one selected from the group consisting of dimethyl dichlorosilane, methyl propyl dichlorosilane, methyl n-hexyl dichlorosilane, methyl n-dodecyl dichlorosilane, methyl β-phenethyl dichlorosilane, methyl phenyl dichlorosilane, methyl p-tolyl dichlorosilane, (2-(3-((trimethylsilyl)oxy) phenyl)-propyl)methyldichlorosilane 1,1-dichloromethyl-2,2-dimethylphenyldisilane, bis(p-n-hexylphenyl)dichlorosilane, methyl 2-(4-cyclohexenyl)ethyl dichlorosilane, 1,1,2,2-tetrachlorodiisopropyl disilane, propyl trichlorosilane, n-hexyl trichlorosilane and dichlorodecamethyl cyclohexasilane.

7. The process of claim 1, wherein the alkali metal is selected from the group consisting of lithium, sodium and potassium.

8. The process of claim 1, wherein the molar ratio of the ether to the organometallic halide monomer is 0.001 to 1.0.

9. The process of claim 8, wherein the molar ratio is 0.1 to 1.0.

10. The process of claim 1, wherein the organometallic polymer contains a unit selected from the group consisting of -(Me)$_2$Si-(Me)(Phenyl)Si-, -(Me)(Pr)Si-(Me)(Phenyl)Si-, -(Bu)$_2$Ge-(Me)(n-Hex)Si-, -Si(Me)(Et)-Si(Me)(Et)-C$_6$H$_4$-, and (CH$_3$)$_2$-Si-Si-CH(CH$_3$)$_2$.

11. The process of claim 1, wherein the alkali metal is sodium and the crown ether is 18-crown-6.

12. The process of claim 1, wherein the alkali metal is sodium and the crown ether is 12-crown-4.

13. The process of claim 1, wherein the organometallic polymer has an molecular weight of about 100,000.

14. The process of claim 11, wherein the organometallic halide is dimethyl dichlorosilane.

15. The process of claim 11, wherein the organometallic halide is methyl propyl dichlorosilane.

16. The process of claim 11, wherein the organometallic halide is di-n-hexyl dichlorosilane.

17. The process of claim 11, wherein the organometallic halide is a mixture of methyl propyl dichlorosilane and methyl phenyl dichlorosilane.

18. The process of claim 11, wherein the organometallic halide is 1,1,2,2-tetrachlorodiisopropyl disilane.

19. The process of claim 12, wherein the organometallic halide is n-hexyl trichlorosilane.

20. The process of claim 1, wherein
said organometallic halide is at least one selected from the group consisting of dimethyl dichlorosilane, methyl propyl dichlorosilane, methyl n-hexyl dichlorosilane, methyl n-dodecyl dichlorosilane, methyl β-phenethyl dichlorosilane, methyl phenyl dichlorosilane, methyl p-tolyl dichlorosilane, (2-(3-((trimethylsilyl)oxy)phenyl)propyl)methyldichlorosilane, 1,1,1-dichloromethyl-2,2,2-dimethylphenyldisilane, di-n-hexyl dichlorosilane, bis(p-n-hexylphenyl)dichlorosilane, methyl 2-(4-cyclohexenyl)ethyl dichlorosilane, dibutyl dichlorogermane, 1,4-bis(chloroethylmethylsilyl)-benzene, 1,1,2,2-tetrachlorodiisopropyl disilane, propyl trichlorosilane, n-hexyl trichlorosilane and dichlorodecamethyl cyclohexasilane; and
said crown ether is at least one selected from the group consisting of 18-crown-6, 15-crown-5, 12-crown-4, 1,3,5-trioxane, 1,4-dioxane, dicyclohexyl 18-crown-6, cyclohexyl 18-crown-6, dibenzo 30-crown-10, dibenzo 24-crown-8 and dibenzo 18-crown-6.

21. The process of claim 1, wherein said crown ether is 1,3,5-trioxane or 1,4-dioxane.

22. In a process for preparing an organosilane polymer having a main chain constituted of a silicon linkage and having a side chain constituted of an organic hydrocarbon group, by condensing a corresponding organometallic halide containing two halogen atoms by reaction with an alkali metal, the improvement comprising the step of polymerizing, by a condensation polymerization reaction, the corresponding organosilicon halide in the presence of the alkali metal and a crown ether having up to 28 carbon atoms and up to 10 oxygen atoms.

23. The process of claim 22, wherein the crown ethers are selected from the group consisting of 18-crown-6, 15-crown-5, 12-crown-4, 1,3,5-trioxane, 1,4-dioxane, dicyclohexyl 18-crown-6, cyclohexyl 18-crown-6, dibenzo 30-crown-10, dibenzo 24-crown-8 and dibenzo 18-crown-6.

24. The process of claim 1, wherein the halide is chloride.

25. The process of claim 1, wherein the halide is bromide.

* * * * *